(12) United States Patent
Gao et al.

(10) Patent No.: US 9,231,284 B2
(45) Date of Patent: Jan. 5, 2016

(54) ELECTRONIC DEVICE WITH POWER INDICATION FUNCTION AND INDICATING METHOD THEREOF

(71) Applicant: ShenZhen Goldsun Network Intelligence Technology Co., Ltd., Shenzhen, GuangDong (CN)

(72) Inventors: Jun-Juan Gao, Shenzhen (CN); Xiao-Wei Yang, Shenzhen (CN); Yang Wang, Shenzhen (CN); Chun-Ching Chen, New Taipei (TW)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 3 days.

(21) Appl. No.: 14/135,804

(22) Filed: Dec. 20, 2013

(65) Prior Publication Data

US 2014/0340232 A1    Nov. 20, 2014

(30) Foreign Application Priority Data

May 16, 2013  (CN) .................. 2013 1 01809786

(51) Int. Cl.
*H01M 10/48*   (2006.01)
*G01R 31/36*   (2006.01)

(52) U.S. Cl.
CPC ............ *H01M 10/488* (2013.01); *H01M 10/48* (2013.01); *G01R 31/3682* (2013.01)

(58) Field of Classification Search
CPC ............... Y02E 60/12; G01R 31/3682; G01R 19/16542; G01R 31/3679; G01R 31/3648; H02J 7/0073

USPC ............... 340/636.1, 636.12, 636.15, 636.19; 320/125, 130; 324/426

See application file for complete search history.

(56) References Cited

U.S. PATENT DOCUMENTS

| | | | |
|---|---|---|---|
| 6,483,275 B1* | 11/2002 | Nebrigic et al. | 320/135 |
| 2004/0257042 A1* | 12/2004 | Liu et al. | 320/130 |
| 2006/0197536 A1* | 9/2006 | Gandhi et al. | 324/426 |
| 2007/0139916 A1* | 6/2007 | Vermillion et al. | 362/208 |
| 2008/0111523 A1* | 5/2008 | Kim | 320/162 |
| 2009/0113093 A1* | 4/2009 | Chen | 710/74 |
| 2011/0031975 A1* | 2/2011 | Kawano et al. | 324/433 |
| 2011/0057807 A1* | 3/2011 | Asai | 340/636.1 |
| 2012/0249323 A1* | 10/2012 | McRae | 340/539.11 |

* cited by examiner

*Primary Examiner* — George Bugg
*Assistant Examiner* — Munear Akki
(74) *Attorney, Agent, or Firm* — Novak Druce Connolly Bove + Quigg LLP

(57) ABSTRACT

An electronic device with a battery displays a label for indicating different power levels of the battery. The label comprises a plurality of columns. Each of the columns is capable of being illuminated. A number of the columns lighted correspond to a corresponding the power levels in a one-to-one relationship. The electronic device comprises a detection module, storage, an acquiring module, a check module, and a display module. The detection module detects the current voltage of the battery at regular intervals and stores the information in the storage. The acquiring module acquires a previous detected voltage from the storage. The check module checks whether the current voltage is a fluctuated voltage. The display displays the label with the numbers of the lighted columns corresponding to the power level which contains the previous detected voltage when the current voltage is a fluctuated voltage.

14 Claims, 4 Drawing Sheets

ELECTRONIC DEVICE WITH POWER INDICATION FUNCTION AND INDICATING METHOD THEREOF

BACKGROUND

1. Technical Field

The present disclosure relates to electronic devices, particularly to an electronic device with power indicating function.

2. Description of Related Art

An electronic device powered by a battery, such as a mobile phone or a tablet computer, displays a label for indicating different power levels of the battery. The label is divided into a plurality of columns which correspond to different ranges of the voltage. Each of the columns is capable of switching between a lighted state and an off state. However, when the voltage of the battery fluctuates between two adjacent voltage ranges, one of the columns switches between the lighted state and the off state which looks like the label is flashing or twinkling.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the communication device and method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as in an EPROM. Modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will be described with reference to the drawings.

Figure 1:
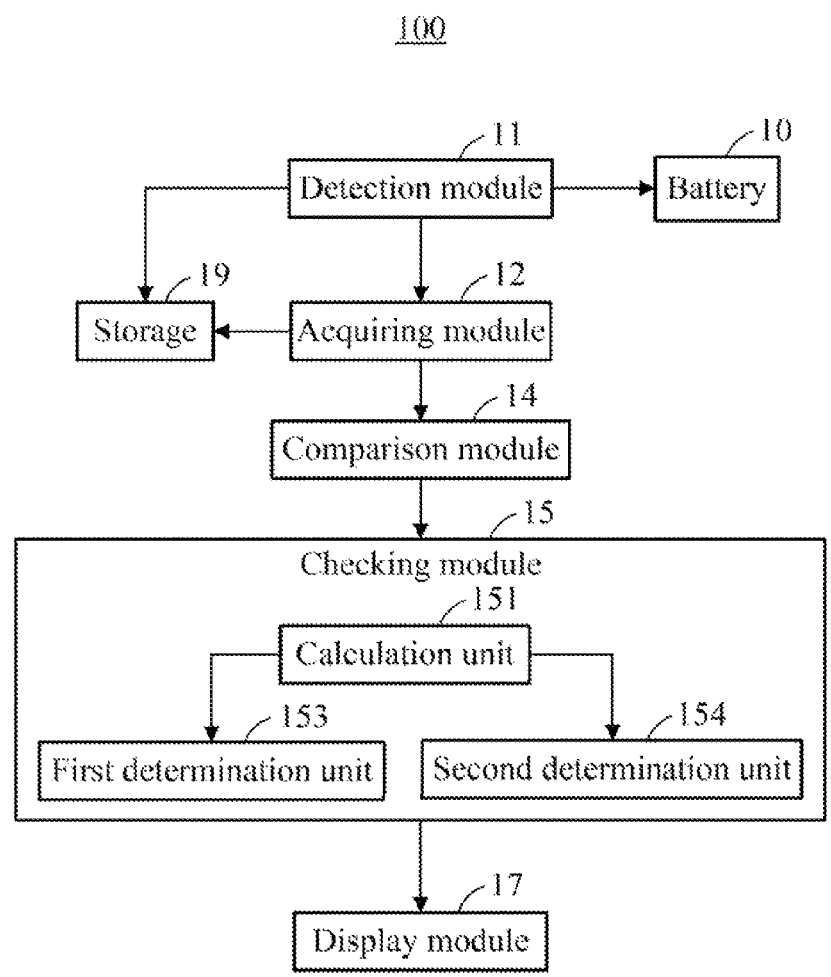
FIG. 1 is a block diagram of an embodiment of an electronic device.
Figure 2:
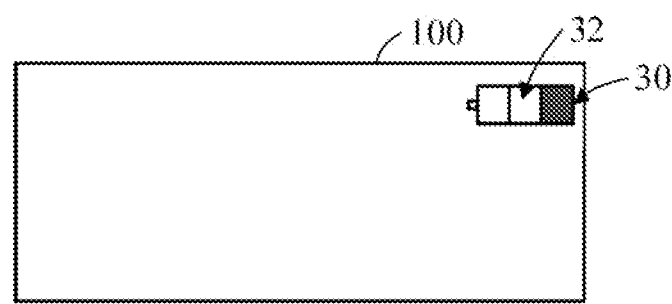
FIG. 2 is a schematic diagram showing an embodiment of a label with a plurality of columns capable of being illuminated, of the electronic device of FIG. 1.
Figure 3:
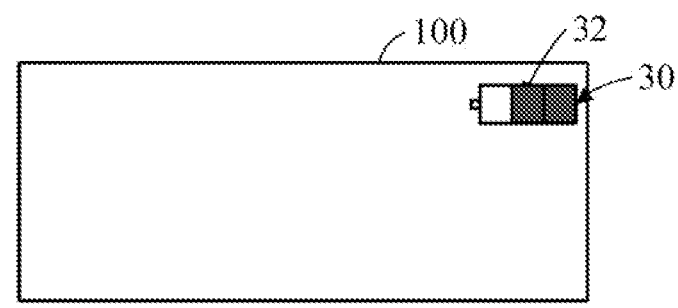
FIG. 3 is a schematic diagram showing an embodiment of the label indicating another power level different from the power level indicated by the label in FIG. 2.

FIG. 1 shows an embodiment of an electronic device 100 including a battery 10 with a plurality of power levels. The power levels of the battery 10 correspond to different voltage ranges respectively. Each of the voltage ranges includes a start voltage and an end voltage. Each of the two adjacent power levels has a common voltage. The electronic device 100 displays a label 30 (as shown in FIG. 2) for indicating a current power level of the battery 10. The label 30 includes a plurality of columns 32. Each of the columns 32 is capable of being illuminated. The different numbers of the columns 32 lighted correspond to power levels in a one-to-one relationship. FIG. 2 illustrates the label 30 with one lighted column 32. The label 30 with one lighted column 32 indicates a first power level. FIG. 3 illustrates the label 30 with two lighted columns 32. The label 30 with the two lighted columns 32 indicates a second power level, which contains the pervious first power level with one lighted column 32. In the embodiment, the electronic device 100 is a mobile phone or a tablet computer.

The electronic device 100 further includes a detection module 11, an acquiring module 12, a comparison module 14, a check module 15, a display module 17, and storage 19.

The detection module 11 is connected to the battery 10, and detects a current voltage of the battery 10 at a time interval, and generates an acquiring signal. The detection module 11 further stores the detected voltage and the corresponding time in the storage 19. In the embodiment, the time interval can be set by operations of users.

The acquiring module 12 is connected to the storage 19, and acquires the previous detected voltage from the storage 19 in response to the acquiring signal.

The comparison module 14 is connected to the acquiring module 12, and compares the current voltage and the previous detected voltage. When the current voltage is more than the previous detected voltage, the electronic device 100 is being charged and the comparison module 14 generates a first state signal. When the current voltage is less than the previous detected voltage, the electronic device 100 is being discharged and the comparison module 14 generates a second state signal.

The check module 15 presets a predetermined value. The check module 15 is connected to the comparison module 14. The check module 15 checks whether the current voltage is a fluctuated voltage which indicates that the voltage change is not affected by being charged or discharged. The check module 15 further generates different control signals to the display module 17 for adjusting the numbers of the lighted columns 32 of the label 30 based on the checking result. The check module 15 includes a calculation unit 151, a first determination unit 153, and a second determination unit 154.

The calculation unit 151 calculates a first limited voltage by adding the start voltage of the power level which contains the current voltage and the predetermined value in response to the first state signal.

The first determination unit 153 determines whether the first limited voltage is more than the current voltage. When the first limited voltage is more than the current voltage, the first determination unit 153 generates a first control signal. When the first limited voltage is less than or equal to the current voltage, the current voltage is considered as a fluctuated voltage and the first determination unit 153 generates a second control signal.

The calculation unit 151 further calculates a second limited voltage by subtracting the predetermined value from the end voltage of the power level which contains the current voltage and in response to the second state signal.

The second determination unit 154 determines whether the second limited voltage is less than the current voltage. When the second limited voltage is less than the current voltage, the second determination unit 154 generates the first control signal. When the first limited voltage is more than or equal to the current voltage, the current voltage is considered as a fluctuated voltage and the second determination unit 154 generates the second control signal.

The display module 17 displays the label 30 with the numbers of lighted columns 32 corresponding to the power level which contains the current voltage in response to the first control signal. The display module 17 further displays the label 30 with the numbers of lighted columns 32 corresponding to the power level which contains the previous detected voltage in response to the second control signal.

In other embodiments, the calculation module 151 calculates the first limited value which is an absolute value of a difference between the current voltage and the start voltage of the power level which contains the current voltage in response to the first signal. The first determination unit 153 determines whether the first limited value is more than the predetermined value. If the first limited value is more than or equal to the predetermined value, the first determination unit 153 generates a first control signal. If the first limited value is less than the predetermined value, the current voltage is considered as a fluctuated voltage and the first determination unit 153 generates a second control signal. The calculation module 151 further calculates the second limited value which is an absolute value of a difference between the current voltage and the end voltage of the power level which contains the current voltage in response to the second signal. The second determination unit 154 determines whether the second limited value is less than the predetermined value. If the second limited value is more than or equal to the predetermined value, the second determination unit 154 generates the first control signal. If the second limited value is less than the predetermined value, the current voltage is considered as a fluctuated voltage and the second determination unit 154 generates the second control signal.

Figure 4:
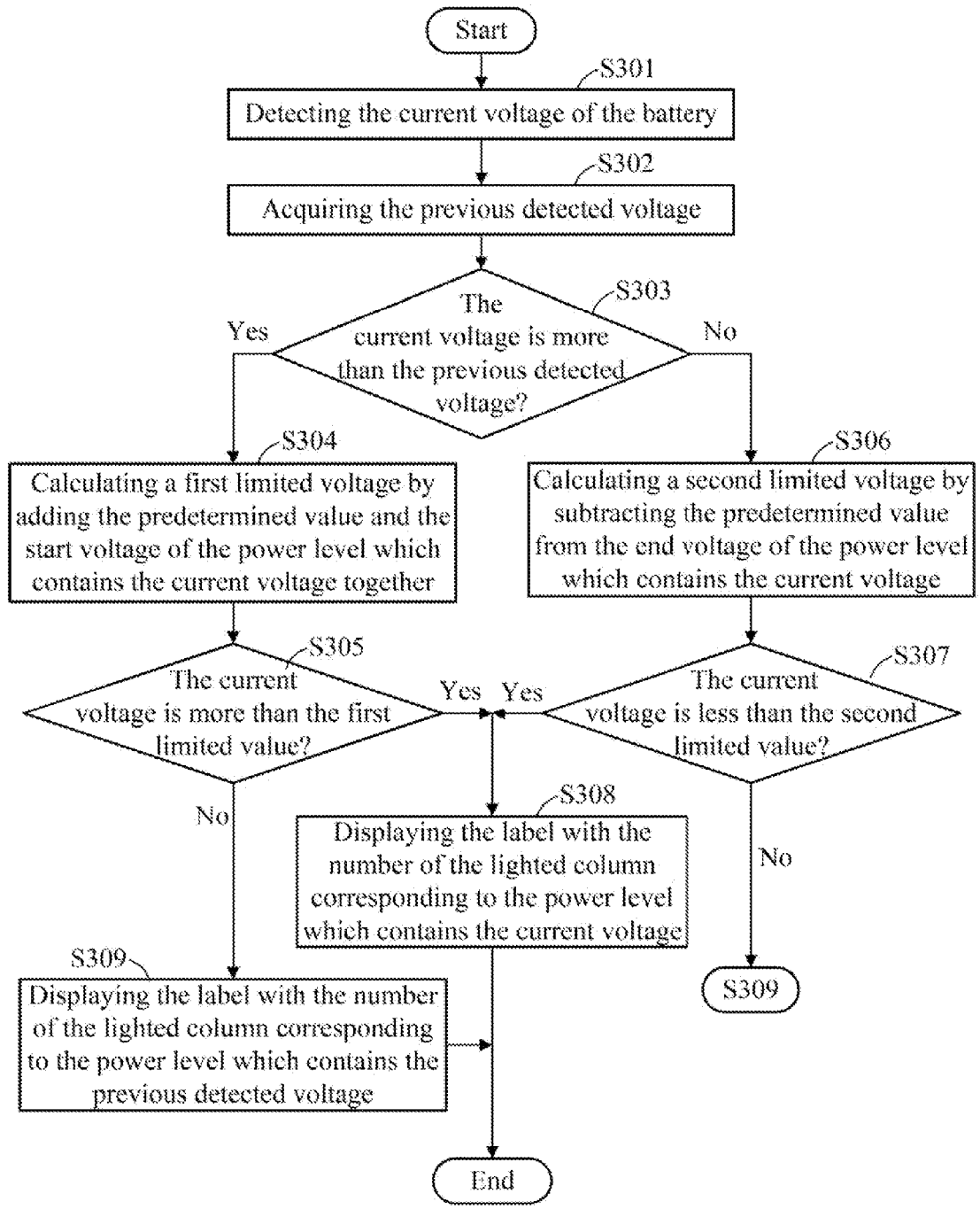
FIG. 4 is a flowchart of an embodiment of an indicating method.

FIG. 4 shows an embodiment of an indicating method applied to an electronic device 100 with a battery 20 with a plurality of power levels for indicating the current power level of the battery 20. The power levels of the battery 10 correspond to different voltage ranges. Each of the voltage ranges includes a start voltage and an end voltage. Each of the two adjacent power levels has a common voltage. The electronic device 100 displays a label 30 (as shown in FIG. 2 and FIG. 3) for indicating a current power level of the battery 10. The label 30 includes a plurality of columns 32. Each of the columns 32 is capable of being illuminated. The different numbers of the columns 32 being lighted correspond to power levels in a one-to-one relationship. In the embodiment, the electronic device 100 is a mobile phone, or a tablet computer, for example. The indicating method includes the following steps.

In step S301, the detection module 11 detects the voltage of the battery at regular intervals and stores the detected voltage and the detecting time in the memory 19. In the embodiment, the time interval can be set by operation of users.

In step S302, in response to the acquiring signal, the acquiring module 12 acquires the previous voltage adjacent to the current voltage.

In step S303, the comparison module 14 compares the current voltage and the previous stored voltage. If the current voltage is more than the previous stored voltage, a first state signal is generated and the procedure goes to S304. If the current voltage is less than the previous stored voltage, a second state signal is generated and the procedure goes to S306.

In step S304, in response to the first state signal, the calculation unit 151 calculates a first limited value by adding the start voltage of the power level which contains the current voltage and a predetermined value together.

In step S305, the first determination unit 153 determines whether the current voltage is more than the first limited voltage. If the current voltage is more than the first limited voltage, a first control signal is generated and the procedure goes to S308. If the current voltage is less than or equal to the first limited voltage, a second control signal is generated for indicating a fluctuated voltage and the procedure goes to S309.

In step S306, in response to the second state signal, the calculation unit 151 calculates a second limited value by subtracting the predetermined value from the end voltage of the power level which contains the current voltage.

In step S307, the second determination unit 154 determines whether the current voltage is less than the second limited voltage. If the current voltage is less than the second limited voltage, a first control signal is generated and the procedure goes to S308. If the current voltage is more than or equal to the second limited voltage, a second control signal is generated for indicating a fluctuated voltage and the procedure goes to S309.

In step S308, in response to the first control signal, the display module 17 displays the label 30 with the numbers of lighted columns 32 corresponding to the power level which contains the current voltage in response to the first control signal.

In step S309, in response to the second control signal, the display module 17 displays the label 30 with the numbers of lighted columns 32 corresponding to the power level which contains the previous detected voltage in response to the second control signal.

In use, when the voltage is fluctuating, the numbers of the lighted columns 32 of the label 30 for indicating the power levels of the battery 10 does not change, such that the flashing or twinkling of the column 32 displayed on the electronic device 100 is improved.

While various embodiments have been described, the disclosure is not to be limited thereto. Various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. An electronic device with a battery capable of displaying a label for indicating different power levels of the battery, the label comprising a plurality of columns, each of the columns capable of being illuminated, a numbers of the columns being lighted corresponding to a corresponding power level of the battery in a one-to-one relationship, the electronic device comprising:
   a detection module for detecting the current voltage of the battery at regular intervals;
   a storage for storing the detected voltage;
   an acquiring module connected to the detection module, and configured to acquiring a previous detected voltage from the storage;
   a check module for checking whether the current voltage is a fluctuated voltage indicating a voltage change is not affected by being charged or discharged, the check module presetting a predetermined value and comprising a calculation unit and a first determination unit;
   a display module connected to the check module, and configured to display the label; and
   a comparison module;
   wherein when the current voltage is a fluctuated voltage, the check module generates a first control signal; the display module displays the label with the number of the lighted columns corresponding to the power level of the previous detected voltage in response to the first control signal;

wherein the power levels correspond to different voltage ranges, each of the voltage ranges comprising a start voltage and an end voltage; and wherein the comparison module compares the current voltage and the previous detected voltage; when the current voltage is more than the previous detected voltage, the comparison unit generates a first state signal for indicating that the electronic device is being charged, the calculation unit calculates a first limited value by adding the predetermined value and the start voltage of the power level which contains the current voltage in response to the first state signal together; the first determination unit determines whether the first limited value is more than the current voltage; when the first limited value is more than the current voltage, the current voltage is the fluctuated voltage.

2. The electronic device of claim 1, wherein the check module further comprises a second determination unit; when the current voltage is less than the previous detected voltage, the comparison unit generates a second state signal for indicating that the electronic device is being discharged, the calculation unit calculates a second limited value by subtracting the predetermined value from the end voltage of the power level which contains the current voltage in response to the second state signal; the second determination unit determines whether the second limited value is less than the current voltage; when the first limited value is more than the current voltage, the current voltage is a fluctuated voltage.

3. The electronic device of claim 1, further comprising a comparison module, wherein the check module presets a predetermined value; the check module comprises a calculation unit and a first determination unit; the comparison module compares the current voltage and the previous detected voltage; when the current voltage is more than the previous detected voltage, the comparison unit generates a first state signal for indicating that the electronic device is being charged, the calculation unit calculates a first limited value which is an absolute value of a difference between the current voltage and the start voltage of the power level which contains the current voltage in response to the first state signal; the first determination unit determines whether the first limited value is less than the predetermined value; when the first limited value is less than the predetermined value, the current voltage is a fluctuated voltage.

4. The electronic device of claim 3, wherein the check module further comprises a second determination unit; when the current voltage is less than the previous detected voltage, the comparison unit generates a second state signal for indicating that the electronic device is being discharged, the calculation unit calculates a second limited value which is an absolute value of a difference between the current voltage and the end voltage of the power level which contains the current voltage in response to the second state signal; the second determination unit determines whether the second limited value is less than the current voltage; when the first limited value is less than the predetermined value, the current voltage is considered as a fluctuated voltage and the first determination unit generates a first control signal.

5. The electronic device of claim 1, wherein when the checking voltage is not a fluctuated voltage, the check module generates a second control signal, and the display module display the label with the number of lighted columns corresponding to the power level which contains the current voltage in response to the second control signal.

6. The electronic device of claim 1, wherein the time interval can be set by operations of users.

7. The electronic device of claim 1, wherein the storage further stores the detecting time corresponding to the detected voltage, and the acquiring module acquires the previous detected voltage based on the detecting time.

8. An indicating method applied to an electronic device with a battery for indicating different power levels of the battery, the label comprising a plurality of columns; each of the columns capable of being illuminated, a numbers of the columns lighted corresponding to a corresponding power level in a one-to-one relationship, the indicating method comprising:

detecting the current voltage of the battery and storing in a storage;

acquiring a previous detected voltage from the storage;

checking whether the current voltage is a fluctuated voltage which indicates that the voltage change is not affected by charging or discharging; and displaying the label with a number of the lighted columns correspond to a corresponding power level of the previous detected voltage when the current voltage is considered as a fluctuated voltage;

wherein the power levels correspond to different voltage ranges; each of the voltage ranges comprising a start voltage and an end voltage; and wherein the electronic device further presets a predetermined value; after the step of acquiring a previous detected voltage from the storage further comprising:

comparing the current voltage and the previous detected voltage;

calculating a first limited value by adding the predetermined value and the start voltage of the power level which contains the current voltage when the current voltage is more than the previous detected voltage together;

determining whether the first limited value is more than the current voltage; and generating a first control signal when the first limited value is more than the current voltage for indicating the current voltage is a fluctuated voltage.

9. The indicating method of claim 8, wherein after the step of comparing the current voltage and the previous detected voltage further comprising:

calculating a first limited value based on the predetermined value and the start voltage of the power level which contains the current voltage when the current voltage is less than the previous detected voltage;

determining whether the second limited value is less than the current voltage; and generating a first control signal when the second limited value is less than the current voltage for indicating the current voltage is a fluctuated voltage.

10. The indicating method of claim 8, wherein the electronic device further presets a predetermined value; after the step of acquiring a previous detected voltage from the storage further comprising:

comparing the current voltage and the previous detected voltage;

calculating a first limited value which is an absolute value of a difference between the current voltage and the start voltage of the power level which contains the current voltage when the current voltage is more than the previous detected voltage;

determining whether the first limited value is less than the predetermined value; and generating a first control signal when the first limited value is less than the predetermined value for indicating the current voltage is a fluctuated voltage.

11. The indicating method of claim 10, wherein after the step of comparing the current voltage and the previous detected voltage further comprising:

calculating a second limited value which is an absolute value of a difference between the current voltage and the end voltage of the power level which contains the current voltage when the current voltage is less than the previous detected voltage;

determining whether the second limited value is less than the predetermined value; and generating a first control signal when the second limited value is less than the predetermined value for indicating the current voltage is a fluctuated voltage.

12. The indicating method of claim 8, wherein when the checking voltage is not a fluctuated voltage, displaying the label with the number of lighted columns corresponding to the power level which contains the current voltage.

13. The indicating method of claim 8, wherein the time interval can be set by operations of users.

14. The indicating method of claim 8, wherein the step of detecting current voltage further comprising: storing the detecting time corresponding to the detected voltage.

* * * * *